(12) United States Patent
Krishnan et al.

(10) Patent No.: US 7,208,380 B2
(45) Date of Patent: Apr. 24, 2007

(54) INTERFACE IMPROVEMENT BY STRESS APPLICATION DURING OXIDE GROWTH THROUGH USE OF BACKSIDE FILMS

(75) Inventors: Anand T. Krishnan, Farmers Branch, TX (US); Srinivasan Chakravarthi, Murphy, TX (US); Haowen Bu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 188 days.

(21) Appl. No.: 11/083,912

(22) Filed: Mar. 18, 2005

(65) Prior Publication Data
US 2005/0208776 A1   Sep. 22, 2005

Related U.S. Application Data

(60) Provisional application No. 60/555,726, filed on Mar. 22, 2004.

(51) Int. Cl.
*H01L 21/336* (2006.01)

(52) U.S. Cl. .................. 438/287; 438/476; 257/E27.06
(58) Field of Classification Search ........ 438/287–288, 438/476
See application file for complete search history.

(56) References Cited

U.S. PATENT DOCUMENTS 6,531,364 B1 * 3/2003 Gardner et al. ............. 438/287

* cited by examiner

*Primary Examiner*—H. Jey Tsai
(74) *Attorney, Agent, or Firm*—Peter K. McLarty; W. James Brady, III; Frederick J. Telecky, Jr.

(57) ABSTRACT

The present invention provides, in one aspect, a method of fabricating a gate oxide layer on a microelectronics substrate. This embodiment comprises forming a stress inducing pattern on a backside of a microelectronics wafer and growing a gate oxide layer on a front side of the microelectronics wafer in the presence of a tensile stress caused by the stress inducing pattern.

20 Claims, 4 Drawing Sheets

US 7,208,380 B2

INTERFACE IMPROVEMENT BY STRESS APPLICATION DURING OXIDE GROWTH THROUGH USE OF BACKSIDE FILMS

CROSS REFERENCE TO RELATED APPLICATION

This application claims the benefit of U.S. Provisional Application No. 60/555,726 entitled "MOS TRANSISTOR INTERFACE IMPROVEMENT BY THE APPLICATION BACKSIDE WAFER STRESS," to Anand T. Krishnan, et al., filed on Mar. 22, 2004, which is commonly assigned with the present invention and incorporated herein by reference as if reproduced herein in its entirety.

TECHNICAL FIELD OF THE INVENTION

The present invention is directed in general to a method for manufacturing a microelectronics device, and more specifically, to a method of improving a silicon/gate oxide interface by applying stress to a microelectronics wafer during the formation of a gate oxide through the use of a backside film.

BACKGROUND

Microelectronic circuits have shrunk well into the submicron range, and their size continues to shrink even further with each passing generation of technology. This continued miniaturization can exacerbate problems that have occurred in previous technologies. One such problematic area is the silicon/gate oxide ($Si/SiO_2$) interface. In spite of constant efforts to improve the quality of the gate oxide, it still can serve as a source of defects that can detrimentally affect the operation of a transistor. For example, because of the way in which the gate oxide is grown from single crystal silicon, different bonds and bonds lengths are present in the two different materials. This causes a lattice mismatch between the gate oxide material and the underlying silicon material, which is highest at the $Si/SiO_2$ interface. Due to their proximity to the channel region, defects at the $Si/SiO_2$ interface have the ability to scatter particles, and they can get electrically charged and create a potential at the interface. Electrons traveling through the channel can be diverted by this potential, which leads to a reduction in current, and in turn, lead to overall degradation of device performance.

Negative bias temperature instability is a degradation mechanism where the application of negative bias on the gate of a p-channel metal oxide semiconductor (PMOS) transistor leads to the creation of interface traps at the $Si/SiO_2$ interface. Interface traps are electrically active defects with an energy distribution throughout the silicon band gap. They act as generation/recombination centers and contribute to leakage current, low-frequency noise, and reduced mobility, drain current, and transconductance. Additionally, the interface trap density induced by NBTI increases with decreasing oxide thickness. This oxide thickness dependence of interface trap generation implies that NBTI becomes more severe for ultra thin oxides, which are currently present in today's technologies. Further, NBTI stress-induced variances in digital device saturation drive current, due to channel degradation, can lead to significant timing issues. For example, if digital signals arrive at different times, signal processing becomes corrupted and ultimately results in circuit failure. NBTI can also be affected by the quality of the gate oxide. Thus, the number of traps or weak spots in the oxide must be minimized to reduce NBTI sensitivity and defects in general.

Accordingly, what is needed in the art is a process for addressing oxide defects attributable to $Si/SiO_2$ lattice mismatch and NBTI.

SUMMARY OF INVENTION

To address the above-discussed deficiencies of the prior art, the present invention provides, in one embodiment, a method of fabricating a gate oxide layer on a microelectronics substrate. This embodiment comprises forming a stress inducing pattern on a backside of a microelectronics wafer and growing a gate oxide layer on a front side of the microelectronics wafer in the presence of a tensile stress caused by the stress inducing pattern.

In another embodiment, the present invention includes a method of fabricating an integrated circuit. In this embodiment, the method comprises fabricating a gate oxide layer on a microelectronics substrate that comprises forming a stress inducing pattern on a backside of a microelectronics wafer and growing a gate oxide layer on a front side of the microelectronics wafer in the presence of a tensile stress caused by the stress inducing pattern. The method further includes forming transistors the gate oxide layer, depositing dielectric layers over the transistors, and forming interconnects within the dielectric layers to interconnect the transistors to form an operative integrated circuit.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention recognizes the advantages associated with growing a gate oxide in the presence of a stress inducing pattern on the backside of a microelectronics wafer. The stress inducing pattern can be grown in such a way as to tailor the amount of tensile stress applied to the front side of the microelectronics wafer during gate oxide formation. It is believed that growing a gate oxide in the presence of such a tensile stress reduces lattice mismatch at the Si/SiO$_2$ interface and improves NBTI. This has the effect of reducing interface trap density and charge build up at the Si/SiO$_2$ interface and thereby improving overall transistor performance.

Figure 1:
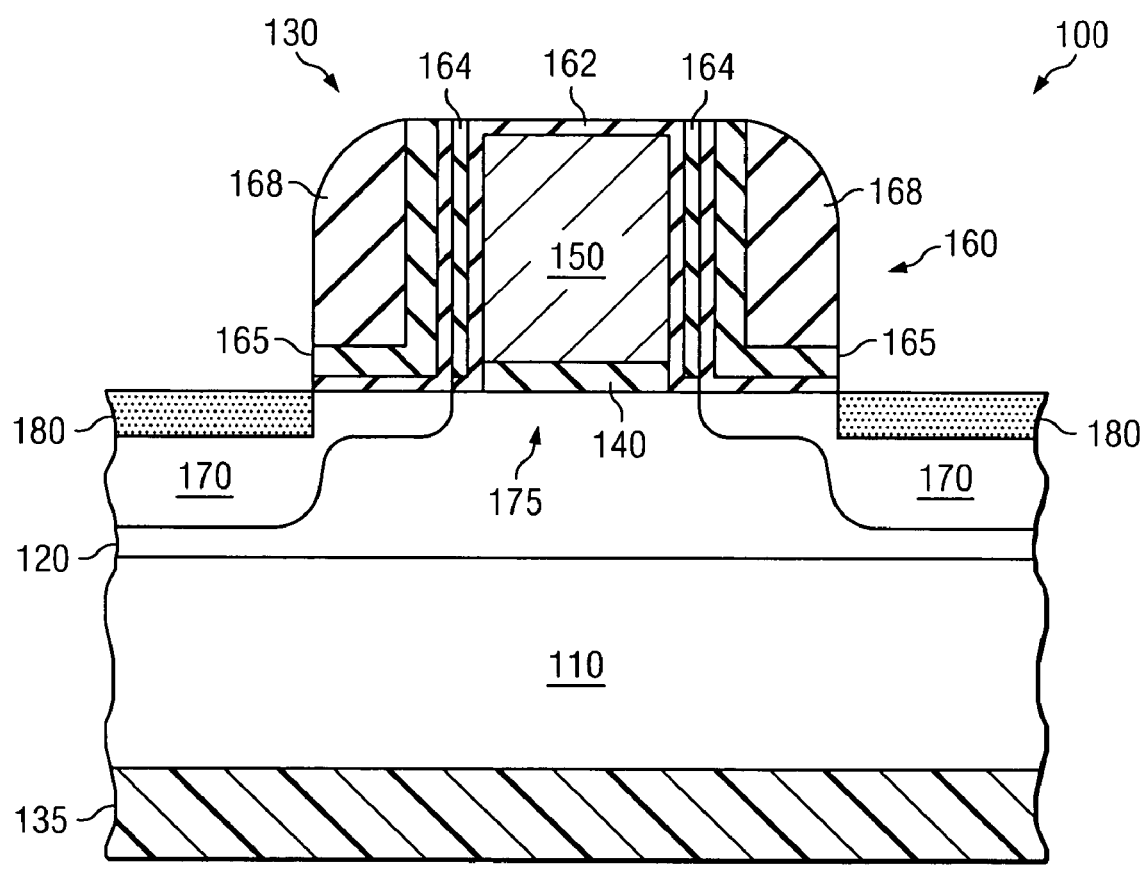
FIG. 1 illustrates a sectional view of one embodiment of a microelectronics device that can be constructed in accordance with the present invention.

Referring initially to FIG. 1, illustrated is a sectional view of one embodiment of a microelectronics device 100, such as a transistor, that can be constructed according to an embodiment of the present invention. In the embodiment illustrated in FIG. 1, the microelectronics device 100 includes a substrate 110, such as a silicon wafer. Located within the substrate 110 is a conventionally formed and doped well region 120. Additionally located over a front side of the substrate 110 and well region 120 is a gate structure 130.

Located on the backside of the substrate 110 is a stress inducing pattern 135. The stress inducing pattern 135 imparts a compressive film that imparts a tensile stress to the front side of the substrate 110 during the growth of a gate oxide 140. Depending on the way in which it is deposited and the materials used, the stress inducing pattern 135 may be tailored to provide the desired amount of tensile stress to the front side of the substrate 110 during gate oxide formation. Thus, in an advantageous application, the stress imparted by the stress inducing pattern 135 to the front side of the substrate 110 is a tensile stress, which would require a compressive type of film on the backside of the substrate 110. The stress inducing pattern 135 may be a blanket deposited film, as shown in FIG. 1 or a patterned material, as discussed below. Alternatively, it may be a stripe patterned formed in or from the substrate 110, itself. As discussed below, various materials or patterns capable of imparting a compressive stress to the backside, and thus a tensile stress to the front side of the substrate, 110 may be used.

An advantage offered by the stress inducing layer 135 in the present invention is that while the thickness of conventional front side layers are limited because of design layouts, the present invention has no such limitations because the stress inducing pattern 135 is located on the backside of the substrate 110. Thus, the stress inducing pattern 135 can be used to significantly increase the stress imparted to the front side of the substrate during the growth of the gate oxide 140 to decrease Si/SiO$_2$ lattice mismatch and thereby reduce interface trap density and NBTI affects, and in turn, increase transistor performance. Moreover, it should be noted that while the stress inducing pattern 135 is shown present at the conclusion of the formation of the microelectronics device 100, the stress inducting pattern 135 may be removed subsequent to the formation of the gate oxide 140.

The gate structure 130 illustrated in FIG. 1 is of conventional design and includes the gate oxide 140 located over the substrate 110, as well as a gate electrode 150 located over the gate oxide 140. However, departing from otherwise conventional processes used to make the microelectronics device 100, and as is explained below, the gate oxide 140 is grown in the presence of the stress inducing pattern 135. The gate electrode 150 may have a variety of thicknesses; nonetheless, a thickness ranging from about 50 nm to about 150 nm is exemplary. The gate electrode 150, when constructed in accordance with the principles of the present invention, may comprise a number of different materials. For instance, in the illustrative embodiment shown in FIG. 1, the gate electrode 150 comprises a polysilicon, but other materials used to construct gate electrode is also within the scope of the present invention. The gate electrode 150 and all other portions of the microelectronics device 100 are conventionally doped in a manner to form an operative device.

The gate structure 130 further includes conventional gate sidewall spacers 160 flanking both sides of the gate electrode 150 and gate oxide 140. The gate sidewall spacers 160 in the embodiment of FIG. 1 each include a number of different layers. For instance, the gate sidewall spacers 160, among other layers, include an oxide layer 162 that extends over the gate electrode 150. Adjacent the oxide layer 162 is a nitride layer 164. The oxide layer 162 and the nitride layer 164 are the layers that serve as an offset spacer during formation of the lightly doped drains (LDD). The gate sidewall spacers 160 further include L-shaped nitride spacers 165 and sidewall oxides 168. The gate sidewall spacers 160 may comprise many different types and numbers of layers while staying consistent with the principles of the present invention.

The microelectronics device 100 illustrated in FIG. 1 additionally includes conventional source/drain regions 170, which, in turn, include LDD extensions, located within the substrate 110 and proximate the gate oxide 140. A channel region 175 is located between the source/drain regions 170. Located within the source/drain regions 170 are conventional silicided source/drain contact regions 180. The silicided source/drain contact regions 180 in this embodiment comprise nickel silicided source/drain contact regions 180. Nonetheless, other silicidation materials could be used to form the silicided source/drain regions 180 and remain within the scope of the present invention. The silicided source/drain contact regions 180 may have a depth into the source/drain regions 170 ranging from about 10 nm to about 30 nm, among others.

Figure 2:
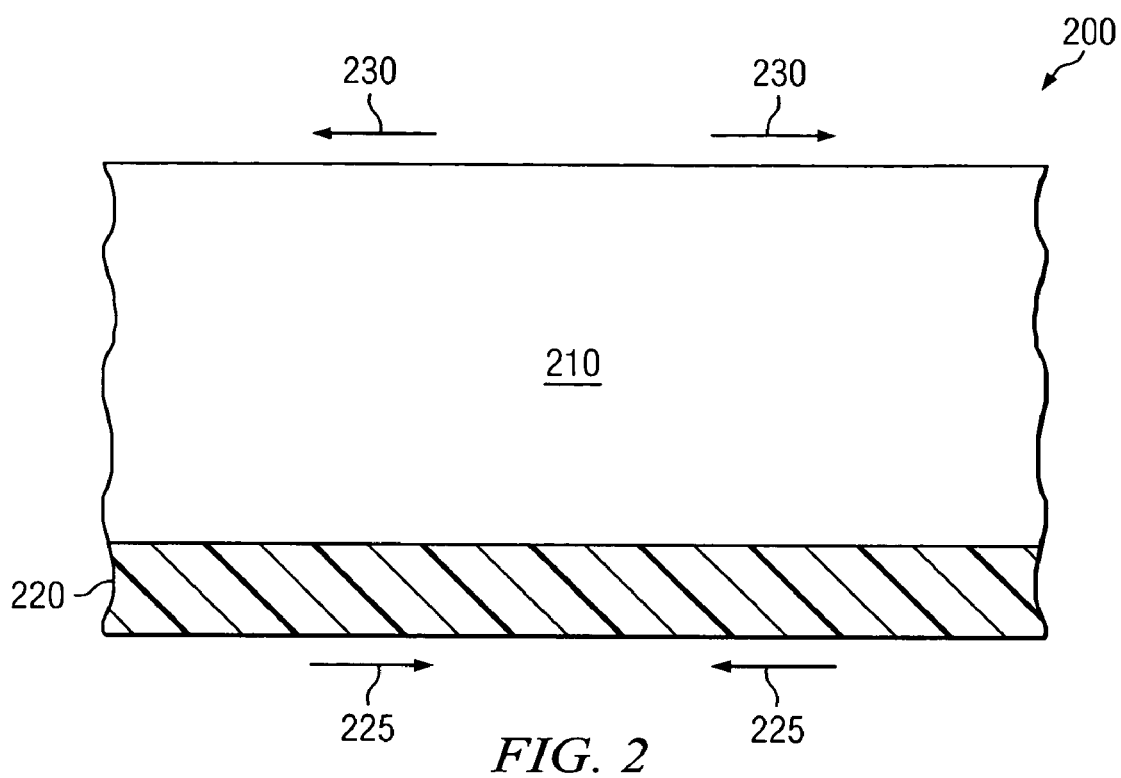
FIG. 2 illustrates a sectional view of a microelectronic substrate after the formation of a stress inducing pattern.

Turning now to FIG. 2, illustrated is a sectional view of a manufacturing step early in the initial stages of fabrication, instructing how one might, in an advantageous embodiment, manufacture a microelectronics device similar to the microelectronics device 100 depicted in FIG. 1. FIG. 2 illustrates a sectional view of a microelectronics device substrate 210, such as a microelectronics wafer, which as been conventionally doped. Located on the backside of the substrate 210 is a stress inducing pattern 220. The stress inducing pattern 220 may be a deposited film, a patterned film or a patterned formed from or in the substrate 210, itself. In the illustrated embodiment, the stress inducing pattern 220 is a blanket deposited film that imparts a compressive film on the backside of the substrate, as indicated by arrows 225 and imparts a tensile stress to the front side of the substrate 210, as indicated by arrows 230. In those embodiments where the stress inducing pattern 220 is a blanket deposited film, the thickness of the stress inducing pattern 220 may range from about 300 nm to greater than 500 nm. The amount of stress to be applied to the front side of the substrate 210 will influence the thickness of the stress inducing pattern, however, in a preferred embodiment, the thickness is greater than about 500 nm.

In one embodiment, the stress inducing pattern 220 is achieved by depositing a silicon nitride layer using a plasma enhanced chemical vapor deposition process (PECVD). In such a PECVD process, the deposition is accomplished by depositing the film at a temperature ranging from about 300 degrees centigrade to about 500 degrees centigrade, using a gas flow of silane ($SiH_4$) having a flow rate ranging from about 50 sccm to about 200 sccm and ammonium ($NH_3$) having a flow rate ranging from about 500 sccm to about 2000 sccm. A carrier gas, such as helium, argon, or nitrogen is also used, and in such embodiments, the carrier gas will have a flow rate ranging from about 1000 sccm to about 5000 sccm. The deposition may be conducted at a pressure ranging from about 2.0 torr to about 2.5 torr and using a high frequency RF power ranging from about 10 watts to about 25 watts and a low Frequency RF power ranging from about 40 watts to about 60 watts. The deposition time may run for about 300 seconds to achieve a layer having a thickness of about 500 nm or more. The above exemplary conditions achieve a stress inducing pattern capable of generating in excess of 1 giga pascals of tensile force to the front side of the substrate 210. In exemplary embodiments, the tensile force will range from about 1 giga pascals to about 3 giga pascals. It should be understood, however, that these deposition conditions may be varied to achieve stress inducing patterns having different forces associated with each and different thicknesses. In an exemplary embodiment, the stress inducing pattern 220 has a thickness that ranges from about 500 nm up to and in excess of 2000 nm.

In other embodiments, the stress inducing pattern 220 may be deposited silicon carbide (SiC), a silicon carbide nitride (SiCN), aluminum oxide ($Al_2O_3$), tantalum pentoxide ($Ta_2O_5$), or silicon germanium (SiGe) materials. Given the teachings set forth herein, one who is skilled in the art would understand how to optimize process conditions to achieve the desired degree of strain with the appropriate amount of thermal stability.

Figure 3:
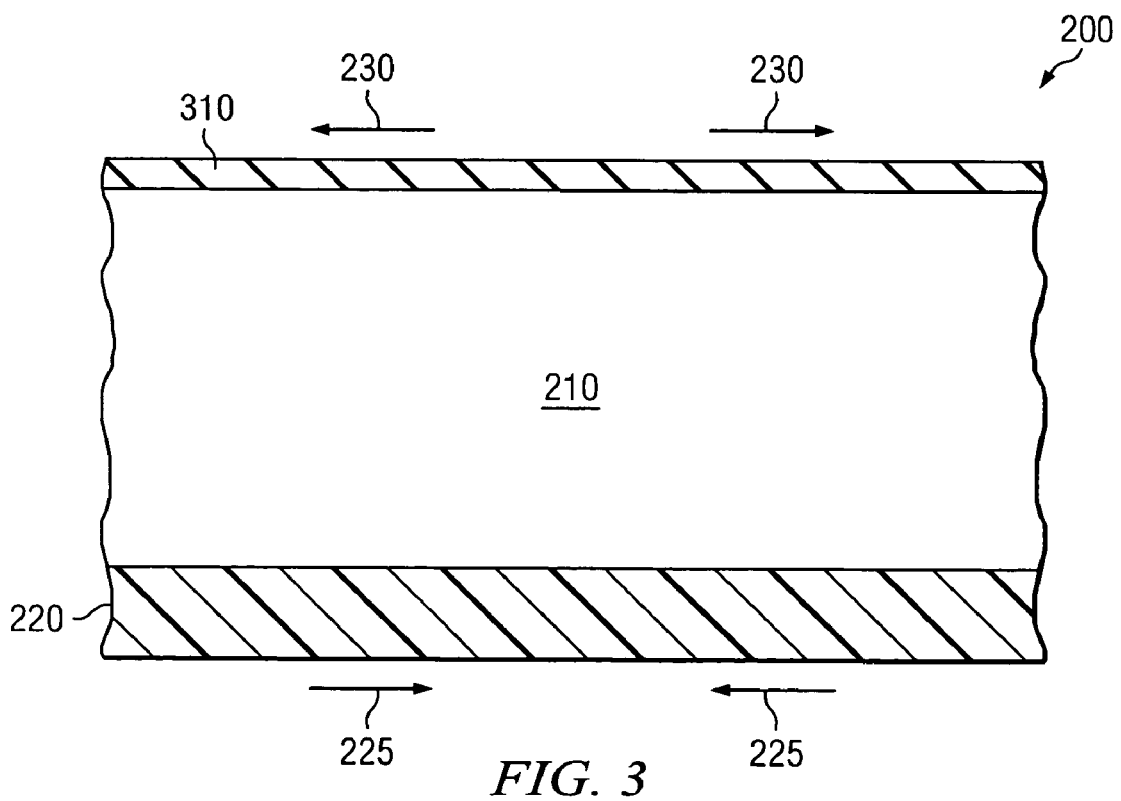
FIG. 3 illustrates a sectional view of the microelectronics substrate of FIG. 2 after the formation of a gate oxide layer grown in the presence of a tensile stress as provided by the stress inducing pattern.

Turning now to FIG. 3 there is illustrated a sectional view of the microelectronics device 200 of FIG. 2 following the deposition of a gate oxide layer 310. In a preferred embodiment, the gate oxide layer 310 is conventionally grown in the presence of oxygen for a period of time that will vary depending on the desired thickness. The temperatures at which oxide layers are grown have steadily dropped as processing techniques have improved over time. Thus, the growth temperature may vary substantially. After the growth of the gate oxide layer 310 as provided herein, one who is skilled in the art would understand how to conduct the other fabrication processes necessary to arrive at the device illustrated in FIG. 1.

For example, the temperature at which the gate oxide is grown may range from as much as 1080 degrees centigrade to as low as 400 degrees centigrade. The lower temperatures would favor those materials that have lower temperature stability. For example, SiN has a low temperature instability and as such would particularly benefit from the lower growth temperatures. The thickness of the gate oxide may also vary, but in an advantageous embodiment, the thickness ranges from about 1 nm to about 10 nm. Because the gate oxide layer 310 is grown in the presence of the tensile stress, which is indicated by arrows 230, inducing pattern 220, interface defects and NBTI effects are significantly lessened. As with FIG. 2, the compressive stress imparted on the backside of the substrate 210 is shown by arrows 225. Interface defects of a gate oxide grown in the presence of a tensile stress can be decreased by as much as 50% or more, which is a significant improvement over conventional processes. Thus, device performance can be substantially improved in growing the gate oxide in the presence of a tensile stress as provided by the present invention.

Figure 4A:
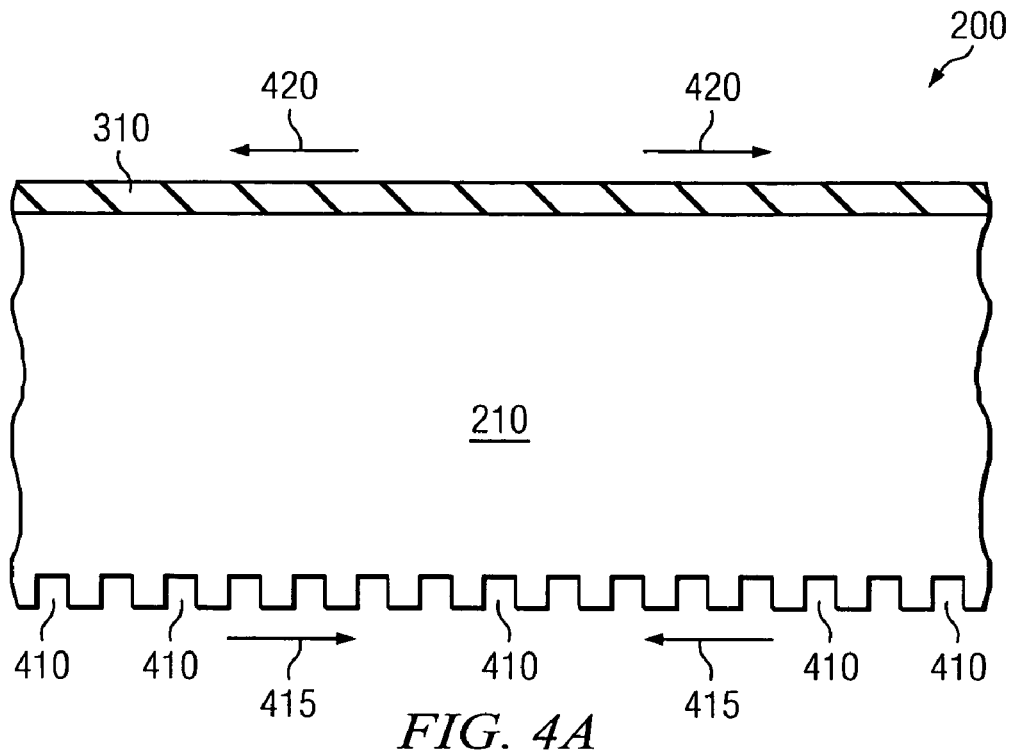
FIG. 4A illustrates a sectional view of an alternative embodiment of the stress inducing pattern wherein the stress inducing pattern is formed by removing a portion of the backside surface of the microelectronics substrate.
Figure 4B:
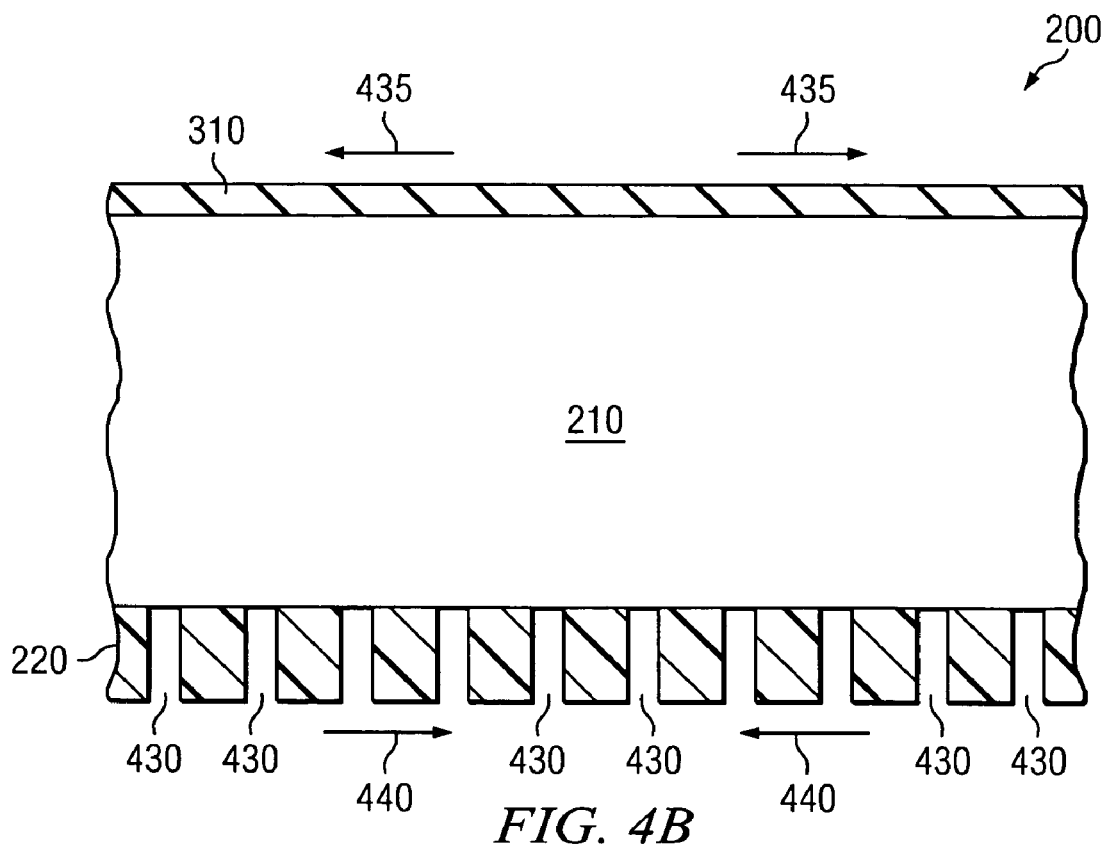
FIG. 4B illustrates a sectional view of an alternative embodiment of the stress inducing pattern wherein the stress inducing pattern is formed by pattering a film deposited on the backside of the microelectronics substrate.

Turning briefly to FIGS. 4A and 4B, there are illustrated sectional views of alternative embodiments of the stress inducing pattern formed in or on a microelectronics substrate 210. In FIG. 4A, a stress inducing pattern 410 has been formed in the substrate 210 by removing a portion of the substrate 210 to form a series of stripes on the back side of the substrate 210. The stress inducing pattern 410, again imparts a compressive stress on the backside of the substrate 210, as indicated by arrows 415, while imparting a tensile stress, indicated by the arrows 420, is imparted to the front side of the substrate 210 during formation of the gate oxide layer 310. The stress inducing pattern 410 may be formed by using photolithographic processes or by mechanical ablation processes. The direction of the stripes will need to be oriented in such a way as to impart a tensile stress to the front side of the substrate 210.

In FIG. 4B, a stress inducing pattern 430 has been formed on the substrate 210 by blanket depositing the film 220, as those discussed above, on the back side of the substrate 210 and patterning the film 220 such that a tensile stress, indicated by the arrows 435, is imparted to the front side of the substrate 210 during formation of the gate oxide layer 310. The film 220 concurrently imparts a compressive stress on the backside of the substrate 210, as indicated by arrows 440. The stress inducing pattern 430 may be formed by using conventional photolithographic processes. Again, the stress inducing pattern will need to be oriented with respect to the device layout to impart the desired tensile stress to the front side of the substrate 210.

Figure 5:
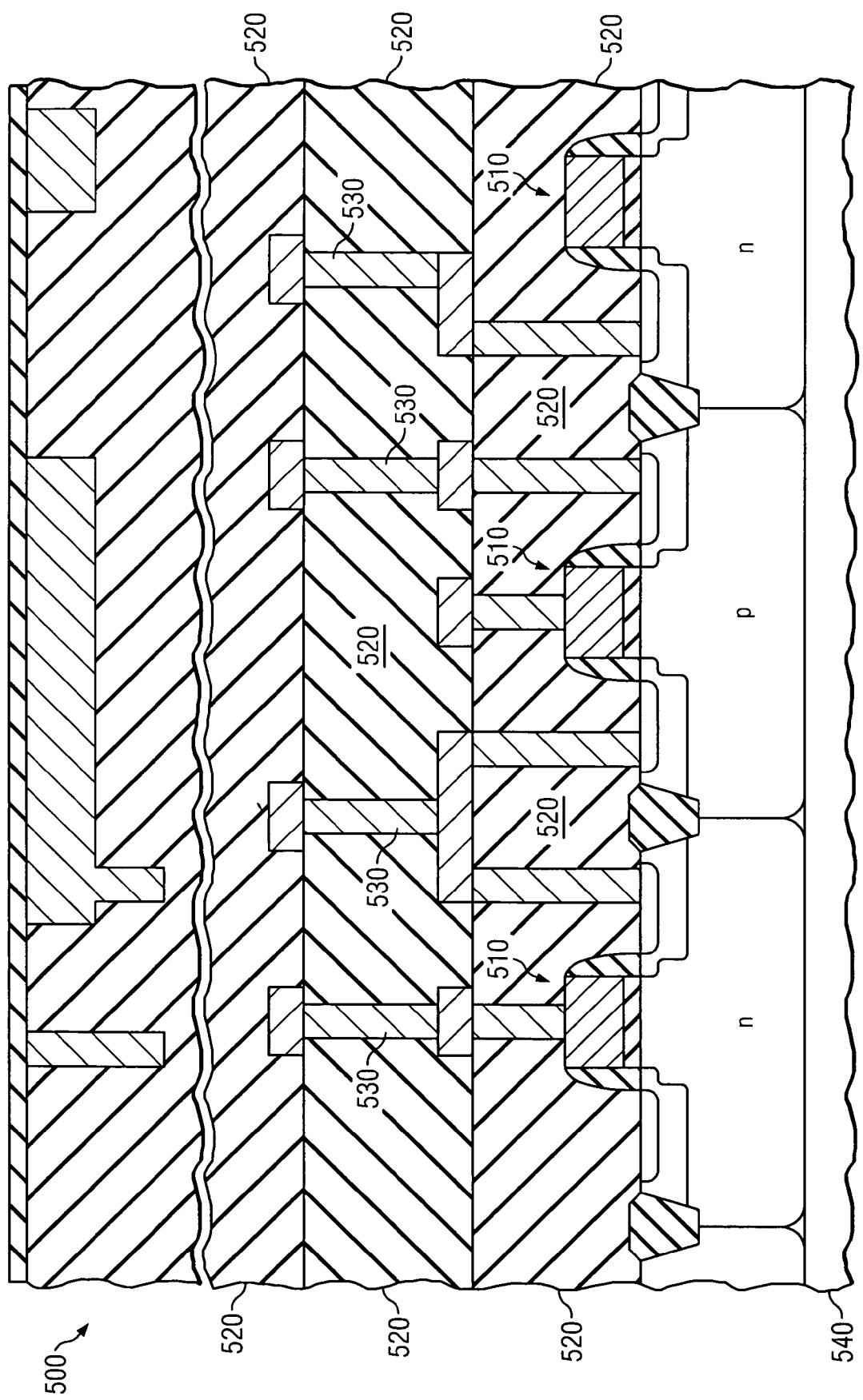
FIG. 5 illustrates a partial sectional view of a multi-layered integrated circuit that can be fabricated according to the principles of the present invention.

Turning now to FIG. 5, there is illustrated a schematic sectional view of an integrated circuit 500 that can be manufactured in accordance with the principles of the present invention. The IC 500 may include devices 510, such as the transistor shown above in FIG. 1, which includes the gate oxide formed as discussed above, to form CMOS devices, BiCMOS devices, Bipolar devices, as well as capacitors or other types of devices. The IC 500 may further include passive devices, such as inductors or resistors, or it may also include optical devices or optoelectronic devices, which are not shown here. Those skilled in the art are familiar with these various types of devices and their manufacture. In the particular embodiment illustrated in FIG. 5, the IC 500 includes the devices 510 having dielectric layers 520 located thereover. Additionally, interconnect structures 530 are located within the dielectric layers 520 to interconnect the various devices 510, thus, forming the operational integrated circuit 500. It should be further noted that the stress inducing pattern that had previously been located on the backside of the microelectronics substrate 540 has been removed by conventional processes. However, as mentioned above, in some embodiments, it may not be removed.

Although the present invention has been described in detail, one who is of ordinary skill in the art should understand that they can make various changes, substitutions, and alterations herein without departing from the scope of the invention.

What is claimed is:

1. A method of fabricating a gate oxide layer on a microelectronics substrate, comprising:
    forming a stress inducing pattern on a backside of a microelectronics wafer; and growing a gate oxide layer on a front side of the microelectronics wafer in the presence of a tensile stress caused by the stress inducing pattern.

2. The method as recited in claim 1, wherein forming comprises forming a stress inducing film to a thickness of about 500 nm or greater.

3. The method as recited in claim 1, wherein the stress inducing pattern is a compressive pattern that provides a tensile stress to the front side of the microelectronics wafer.

4. The method as recited in claim 1, wherein forming a stress inducing pattern comprises forming a stress inducing pattern that is thermally stable during growing the gate oxide and provides a stress to the front side of the microelectronics wafer ranging from about 1 giga pascals to about 3 giga pascals during the growing of the gate oxide.

5. The method as recited in claim 1, wherein forming comprises forming a stripped pattern from a stress inducing film.

6. The method as recited in claim 1, wherein forming comprises removing a portion of a surface of the backside of the microelectronics wafer to form the stress inducing pattern.

7. The method as recited in claim 1, wherein growing the gate oxide comprises growing a gate oxide at a temperature ranging from about 1080 degrees centigrade to about 400 degrees centigrade.

8. The method as recited in claim 1, wherein the stress inducing pattern comprises silicon nitride.

9. The method as recited in claim 8, wherein forming the stress inducing pattern comprises forming a silicon nitride film by plasma enhance chemical vapor deposition, wherein plasma deposition parameters comprises conducting the plasma deposition at a temperature ranging from about 400 degrees centigrade to about 500 degrees centigrade, at a pressure ranging from about 2 torr to about 2.5 torr, at a silane gas flow ranging from about 50 sccm to about 300 sccm, at an ammonia gas flow ranging from about 500 scam to about 2000 scam, at a carrier gas flow ranging from about 1000 scam to about 5000 scam, at a high frequency RF power ranging from about 10 watts to about 25 watts and a low frequency RF power ranging from about 40 watts to about 60 watts.

10. The method as recited in claim 1, wherein the stress inducing pattern comprises silicon carbide (SiC), silicon carbide nitride (SiCN), aluminum oxide ($Al_2O_3$), tantalum pentoxide ($Ta_2O_5$), or silicon germanium (SiGe).

11. A method of fabricating an integrated circuit, comprising:
fabricating a gate oxide layer on a microelectronics substrate, comprising:
forming a stress inducing pattern on a backside of a microelectronics wafer; and
growing a gate oxide layer on a front side of the microelectronics wafer in the presence of a tensile stress caused by the stress inducing pattern;
forming transistors the gate oxide layer;
depositing dielectric layers over the transistors; and
forming interconnects within the dielectric layers to interconnect the transistors to form an operative integrated circuit.

12. The method as recited in claim 11, wherein forming comprises forming a stress inducing film to a thickness of about 500 nm or greater.

13. The method as recited in claim 11, wherein the stress inducing pattern is a compressive pattern that provides a tensile stress to the front side of the microelectronics wafer.

14. The method as recited in claim 11, wherein forming a stress inducing pattern comprises forming a stress inducing pattern that is thermally stable during growing the gate oxide and provides a stress to the front side of the microelectronics wafer ranging from about 1 giga pascals to about 3 giga pascals during the growing of the gate oxide.

15. The method as recited in claim 11, wherein forming comprises forming a stripped pattern from a stress inducing film.

16. The method as recited in claim 11, wherein forming comprises removing a portion of a surface of the backside of the microelectronics wafer to form the stress inducing pattern.

17. The method as recited in claim 11, wherein growing the gate oxide comprises growing a gate oxide at a temperature ranging from about 1080 degrees centigrade to about 400 degrees centigrade.

18. The method as recited in claim 11, wherein the stress inducing pattern comprises silicon nitride.

19. The method as recited in claim 18, wherein forming the stress inducing pattern comprises forming a silicon nitride film by plasma enhance chemical vapor deposition, wherein plasma deposition parameters comprises conducting the plasma deposition at a temperature ranging from about 400 degrees centigrade to about 500 degrees centigrade, at a pressure ranging from about 2 torr to about 2.5 torr, at a silane gas flow ranging from about 50 sccm to about 300 sccm, at an ammonia gas flow ranging from about 500 sccm to about 2000 sccm, at a carrier gas flow ranging from about 1000 sccm to about 5000 sccm, at a high frequency RF power ranging from about 10 watts to about 25 watts and a low frequency RF power ranging from about 40 watts to about 60 watts.

20. The method as recited in claim 11, wherein the stress inducing pattern comprises silicon carbide (SiC), silicon carbide nitride (SiCN), aluminum oxide ($Al_2O_3$), tantalum pentoxide ($Ta_2O_5$), or silicon germanium (SiGe).

* * * * *